US010281220B1

(12) United States Patent
Lin et al.

(10) Patent No.: US 10,281,220 B1
(45) Date of Patent: May 7, 2019

(54) HEAT SINK WITH VAPOR CHAMBER

(71) Applicant: ZT Group Int'l, Inc., Secaucus, NJ (US)

(72) Inventors: Ting Yu Lin, Bloomfield, NJ (US); Cheng Chen, East Rutherford, NJ (US); Pinghung Ho, Edison, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 27 days.

(21) Appl. No.: 15/242,140

(22) Filed: Aug. 19, 2016

(51) Int. Cl.
*F28F 3/02* (2006.01)
*F28D 15/02* (2006.01)
*F28D 21/00* (2006.01)

(52) U.S. Cl.
CPC ............ *F28D 15/0275* (2013.01); *F28F 3/02* (2013.01); *F28D 2015/0216* (2013.01); *F28D 2021/0029* (2013.01); *F28F 2215/04* (2013.01)

(58) Field of Classification Search
CPC ......... F28D 15/0275; F28D 2015/0216; F28D 2021/0029; F28F 3/02; F28F 2215/04
See application file for complete search history.

(56) References Cited

U.S. PATENT DOCUMENTS

| | | | | |
|---|---|---|---|---|
| 6,189,601 B1* | 2/2001 | Goodman | ............ | F28D 15/0233 165/104.33 |
| 7,100,681 B1* | 9/2006 | Wu | ...................... | F28D 15/0266 165/104.21 |
| 7,110,259 B2* | 9/2006 | Lee | ...................... | H01L 23/427 165/104.33 |
| 7,423,877 B2* | 9/2008 | Zhou | ..................... | H01L 23/427 165/104.33 |
| 7,443,677 B1* | 10/2008 | Zhou | ................... | F28D 15/0275 165/104.21 |
| 8,376,587 B2* | 2/2013 | Liu | ........................ | F21V 29/02 362/249.02 |
| 8,443,613 B2* | 5/2013 | Quisenberry | ...... | B60H 1/00478 62/3.61 |
| 2003/0019610 A1* | 1/2003 | Liu | ........................ | F28D 15/00 165/80.3 |
| 2005/0092465 A1* | 5/2005 | Lin | ..................... | F28D 15/0275 165/104.21 |
| 2005/0241808 A1* | 11/2005 | Lee | ..................... | F28D 15/0275 165/104.33 |

(Continued)

FOREIGN PATENT DOCUMENTS

| | | | | |
|---|---|---|---|---|
| JP | | 3451498 B2 * | 9/2003 | ......... F28D 15/0233 |
| JP | | 2005331233 A * | 12/2005 | ........... F28D 1/0477 |

OTHER PUBLICATIONS

Heat Pipes Review, Opportunities and Challenges—Faghri (2014).*

*Primary Examiner* — Cassey D Bauer
*Assistant Examiner* — Jenna M Hopkins
(74) *Attorney, Agent, or Firm* — Dergosits & Noah LLP; Todd A. Noah

(57) ABSTRACT

A heat sink is disclosed in which a set of fins dissipates heat, where the heat is conducted from a heat source to two sides of the set of fins by a vapor chamber assembly. In an embodiment, a thin vapor chamber assembly is configured to conduct heat to both the bottom and the top of a set of fins. In an embodiment, a thin vapor chamber assembly is configured to conduct heat to a lower set of fins and also to an upper set of fins.

9 Claims, 7 Drawing Sheets
(3 of 7 Drawing Sheet(s) Filed in Color)

(56) References Cited

U.S. PATENT DOCUMENTS

| | | | | |
|---|---|---|---|---|
| 2005/0257532 | A1* | 11/2005 | Ikeda | F25B 21/02 62/3.7 |
| 2006/0060328 | A1* | 3/2006 | Ewes | H01L 23/427 165/80.2 |
| 2007/0145572 | A1* | 6/2007 | Chen | F28D 15/0266 257/718 |
| 2007/0251670 | A1* | 11/2007 | Peng | H01L 23/427 165/80.4 |
| 2008/0043438 | A1* | 2/2008 | Refai-Ahmed | F28D 15/0266 361/700 |
| 2008/0093055 | A1* | 4/2008 | Tzeng | F28D 15/0233 165/104.26 |
| 2009/0236078 | A1* | 9/2009 | Luo | F21V 29/004 165/80.3 |
| 2009/0313827 | A1* | 12/2009 | Chen | B23P 15/26 29/890.03 |
| 2010/0073880 | A1* | 3/2010 | Liu | H01L 23/427 361/700 |
| 2011/0024087 | A1* | 2/2011 | Lin | H01L 23/427 165/104.26 |
| 2011/0100604 | A1* | 5/2011 | Anzai | B21D 53/08 165/104.21 |
| 2012/0186787 | A1* | 7/2012 | Dinh | F24F 12/002 165/104.26 |
| 2012/0211201 | A1* | 8/2012 | Kunstwadl | F21V 29/004 165/104.21 |
| 2015/0043167 | A1* | 2/2015 | Guenin | H01L 23/3672 361/719 |
| 2015/0233647 | A1* | 8/2015 | Quisenberry | F28D 15/04 62/3.7 |

* cited by examiner

HEAT SINK WITH VAPOR CHAMBER

BACKGROUND

A heat sink is the main path for dissipating heat from a CPU. CPUs develop considerable amounts of heat, with more powerful CPUs creating even more heat. With CPUs producing ever-increasing amounts of heat, and proper CPU function depending in part on dissipating that heat, a heat sink is an important addition to a circuit board.

Although typical heat sinks may be capable of dissipating heat, an improved heat sink may benefit a system by reducing the required air flow and, consequently, reducing the power consumed by the fan.

There are several traditional ways to improve heat sink performance. For example, a heat sink may use material of higher conductivities, such as copper (Cu) as the fin material. A heat sink may use heat pipes and heat spreader to distribute heat within the fins. Also, if space allows, the demand for better convective heat transfer may be met by more and taller heat sink fins.

However, traditional ways to improve heat sink performance have their drawbacks. Cu is heavier and more expensive—it becomes impractical to use Cu in heat sinks for servers with 1.5 U and 2 U form factors. Adding heat pipes to transport heat within heat sinks requires cutting holes in the heat sink fins, which is a complicated process and also reduces the convective area. A heat spreader may improve the heat distribution, but that does not otherwise improve fin efficiency. And for taller heat sinks (e.g., 1.5 U or 2 U, where a 1.5 U heat sink height may be 45 mm or less and a 2 U heat sink may be from 45 to 75 mm), the thermal resistance between heat source and fin end is increased, which may reduce the efficiency of such heat sinks.

Furthermore, heat sink design may be limited by the available package volume. For example, a heat sink design may be limited to the volume available in a server with a 2 U form factor, which is typically 90 mm×90 mm×64 mm (LWT). Another pre-determined volume may be 90 mm×116 mm×64 mm.

Therefore, the need exists for a more efficient heat sink. Also, the need exists for a more efficient heat sink that will fit in a pre-defined volume.

BRIEF DESCRIPTION OF THE DRAWINGS

The patent or application file contains at least one drawing executed in color. Copies of this patent or patent application with color drawing(s) will be provided by the Office upon request and payment of the necessary fee.

DETAILED DESCRIPTION

Figure 1:
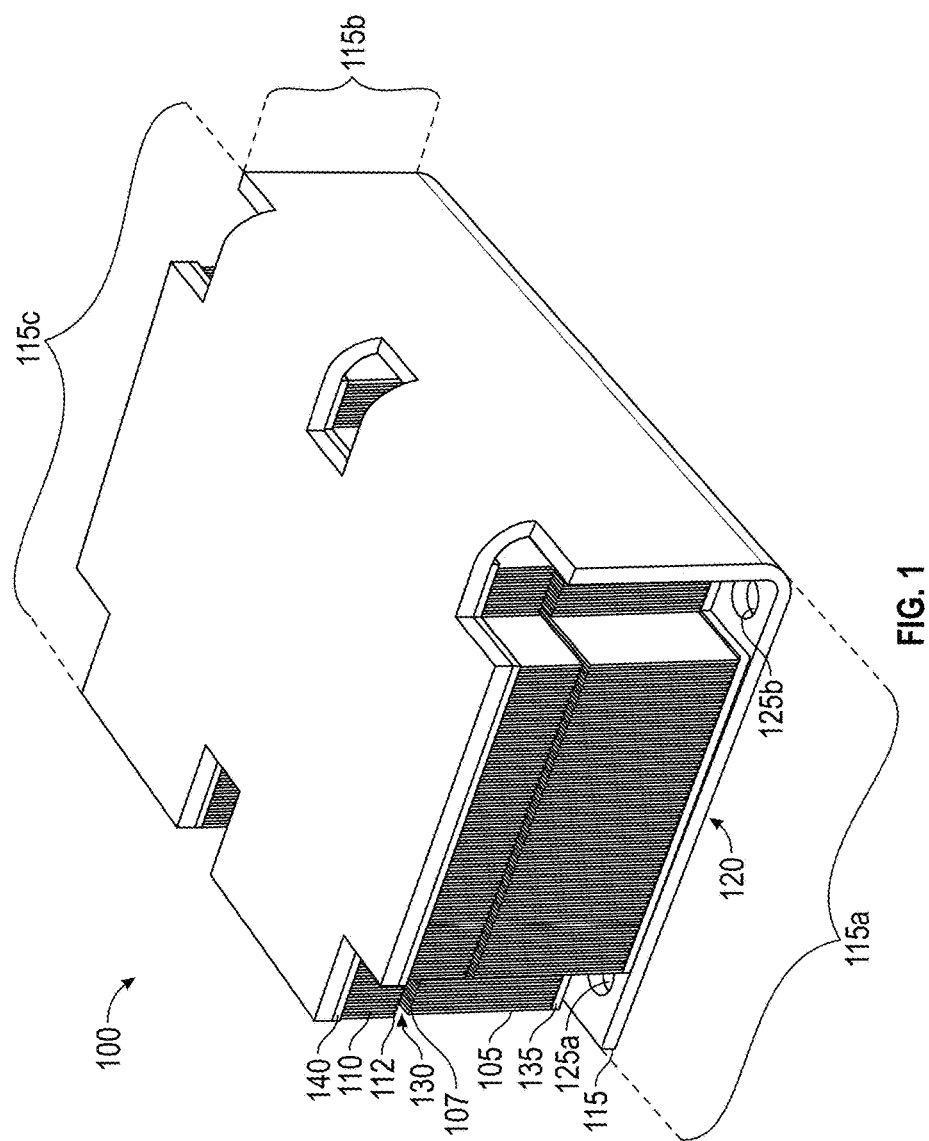
FIG. 1 is a perspective drawing illustrating an embodiment of a heat sink with a vapor chamber.

In an embodiment, a heat sink's efficiency is improved by taking advantage of a vapor chamber's high thermal conductivity to reduce the effective distance from fin "base" to fin "end." In an embodiment, a heat sink may use a thin vapor chamber to conduct heat from a heat source near a "base" side of a set of planar fins to the opposing "end" side of the set of fins. In the embodiment each single fin is in thermally-conductive contact with the vapor chamber at both the fin base and the opposing fin end. In the embodiment, the thin vapor chamber may be configured in the general shape of a squared-off "C," where the bottom of the C is a source interface section that is closest to the heat source and is in contact with the fin "bases," the top of the C is a sink interface section that is furthest from the heat source and is in contact with the fin "tops," and the side of the C conducts heat from the source interface section to the sink interface section. In the embodiment, the set of fins is disposed between the bottom of the C and the top of the C.

In an embodiment, a heat sink may use a thin vapor chamber to conduct heat from a heat source near a "base" side of a first set of planar fins to a "base" side of a second set of planar fins. In the embodiment each single fin is attached to the vapor chamber at only the fin base, and is not attached at the opposing fin end. In the embodiment, the thin vapor chamber may be configured in the general shape of a squared-off "C," where the bottom of the C is a source interface section that is closest to the heat source and is in contact with the fin "bases" of the first set of fins, the top of the C is a sink interface section that is furthest from the heat source and is in contact with the fin "bases" of the second set of fins, and the side of the C conducts heat from the source interface section to the sink interface section. In the embodiment, both the first and second sets of fins are disposed between the bottom of the C and the top of the C.

In an embodiment, the fins in contact with a source interface section of a vapor chamber are longer than the fins in contact with a sink interface section of a vapor barrier. The lengths may be chosen to balance the thermal resistance of the shorter fins with respect to the longer fins, since the shorter fins have a longer section of vapor chamber between them and the heat source.

In an embodiment, a thin Cu layer (or Al layer, or Al/Cu layer) may be added between the fins and the vapor chamber to improve the conduction of heat between the vapor chamber and the fins.

In an embodiment, the squared-off "C" shape is created using three separate vapor chambers—a first vapor chamber as the source interface section, a second vapor chamber as the sink interface section, and a third vapor chamber thermally connecting the first and second vapor chambers.

Embodiments may be adapted to many different shapes of heat sinks. For example, embodiments may be adapted to replace traditional heat sinks for CPUs in servers with 1.5 U and 2 U form factors. Embodiments may also use other highly-conductive structures instead of vapor chambers. For example, all or part of the source interface section, sink interface section, or connecting section may use another thermally-conductive structure, such as a heat pipe, or chemical vapor-deposited diamond layer.

Benefits and advantages of the embodiments of the heat sink include improved fin efficiency and reduced thermal resistance. These improvements should result in cost savings from a corresponding reduction in the required fan power.

In an embodiment, a vapor chamber may be used to improve a heat sink's efficiency by reducing the effective distance from fin "base" to fin "end." A vapor chamber (or "thin planar heat pipe") distributes heat across its area using a working fluid within a sealed volume. The working fluid undergoes a phase change to a gas in the source interface section of a vapor chamber. The gas then travels to the sink interface section of the vapor chamber and undergoes a phase change back into a liquid as the thermal energy in the gas is conducted away from the from the gas. The liquid is transported back to the source interface section and the cycle continues. In some embodiments, vapor chambers are preferable to heat pipes because they generally provide a larger area and higher thermal conductivity. Vapor chambers (and heat sinks, for that matter) function regardless of orientation, for example, with or against gravity, so "top" and "bottom" are relative, with the "bottom" of a vapor chamber (or heat sink) generally being nearest the heat source and the "top" being furthest from the heat source.

Embodiments will now be described with regard to the figures, which are exemplary and should not be construed to limit the claimed subject matter.

FIG. 1 is a perspective drawing illustrating an embodiment of a heat sink 100 with a vapor chamber 115. In the embodiment, heat sink 115 is in a "folded" configuration with a heat source section 115a, a connecting section 115b, and a heat sink section 115c. From one perspective, the "folded" configuration may appear to assume the shape of a squared-off "C." Heat sink 100 includes a set of lower fins 105 and a set of upper fins 110. Lower fins 105 are mounted to and in thermally-conductive contact with a lower plate 135, which is thermally conductive and in thermally-conductive contact with source interface section 115a. Upper fins 110 are mounted to and in thermally-conductive contact with an upper plate 140, which is itself in thermally-conductive contact with source interface section 115c. Upper fins 110 are separated from lower fins 105 by a gap 130 between upper fin ends 112 and lower fin ends 107. Source interface section 115a has a contact section 120 for contacting a heat source, such as an integrated circuit (IC). The size of contact section 120 would depend on the size of the intended heat source. Attachment points 125a, 125b, 125c (not shown), and 125d (not shown) may be used to attach heat sink 100 to, for example, a printed circuit board (PCB) and in contact with an IC.

In the embodiment, heat from a heat source in contact with contact section 120 is conducted to heat interface section 115a of vapor chamber 115. Heat interface section 115a spreads the heat, distributing heat to lower plate 135 and lower fins 105, and through conducting section 115b to sink interface section 115c. Sink interface section 115c conducts heat to upper plate 140 and to upper fins 110. Upper fins 110 and lower fins 105 may radiate heat either passively, or actively with the aid of an air flow in the direction of the fins (arrow 145), which may be created by a fan.

Fins 105 and 110 and plates 135 and 140 may be conductive materials, for example, Cu or Al, or a combination. Vapor chamber 115 may be as thin as, for example, 1.0 mm and may contain working fluids chosen based on the designed operating temperature. For example, ammonia, methanol, ethanol, and water may be used as working fluids and have different operating temperatures.

In an embodiment, the lengths of fins 105 and fins 110 may be changed to balance the thermal resistances and improve fin efficiency. The optimum fin size is determined by simulation study or analytical calculation, aiming at lowest CPU temp. From the perspective of thermal resistance, proper fin sizes would provide similar thermal resistance from the heat source to fin end 107 and from the heat source to fin end 112.

In an embodiment intended for use with a CPU in a server with a 1.5 U form factor (90 mm×108 mm×45 mm) and an anticipated temperature range of 5-40° C. ambient temperature and 60-80° C. CPU Tcase temperature range, vapor chamber 115 has dimensions 90 mm×108 mm×3 mm and uses water as a working fluid, fins 105 are made of aluminum and have dimensions of 0.3 mm×108 mm×25 mm (L×W×H) fins 110 are made of aluminum and have dimensions of 0.3 mm×108 mm×9.5 mm, and plates 135 and 140 have dimensions of 90 mm×108 mm×1.5 mm and are made of copper.

Figure 2:
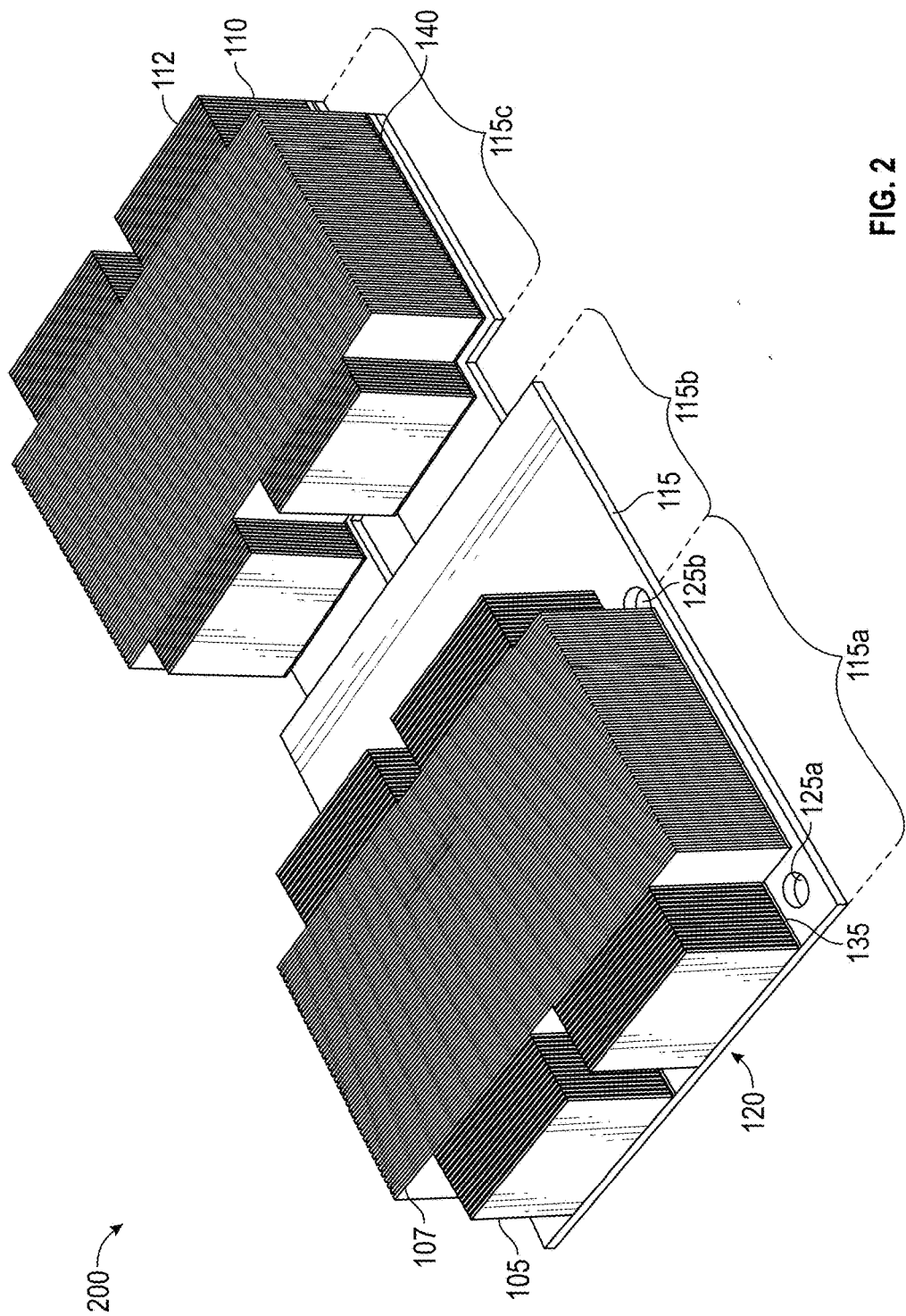
FIG. 2 is a perspective drawing illustrating an embodiment of a heat sink with a vapor chamber.

FIG. 2 is a perspective drawing illustrating an embodiment of heat sink 200 with a vapor chamber 115. In the embodiment, heat sink 115 is in an "unfolded" configuration with heat source section 115a, connecting section 115b, and heat sink section 115c all on the same plane. As with heat sink 100, heat sink 200 includes lower fins 105 and upper fins 110. Lower fins 105 are mounted to and in thermally-conductive contact with lower plate 135, which is itself thermally conductive and in thermally-conductive contact with source interface section 115a. Upper fins 110 are mounted to and in thermally-conductive contact with an upper plate 140, which is itself in thermally-conductive contact with source interface section 115c. Source interface section 115a has contact section 120 for contacting a heat source, such as an integrated circuit. The size of contact section 120 would depend on the size of the intended heat source. Heat sink 200 may be formed into the configuration of heat sink 100 by bending vapor chamber 115 between source interface section 115a and connecting section 115b, and bending vapor chamber 115 between connecting section 115b and sink interface section 115c.

Figure 3:
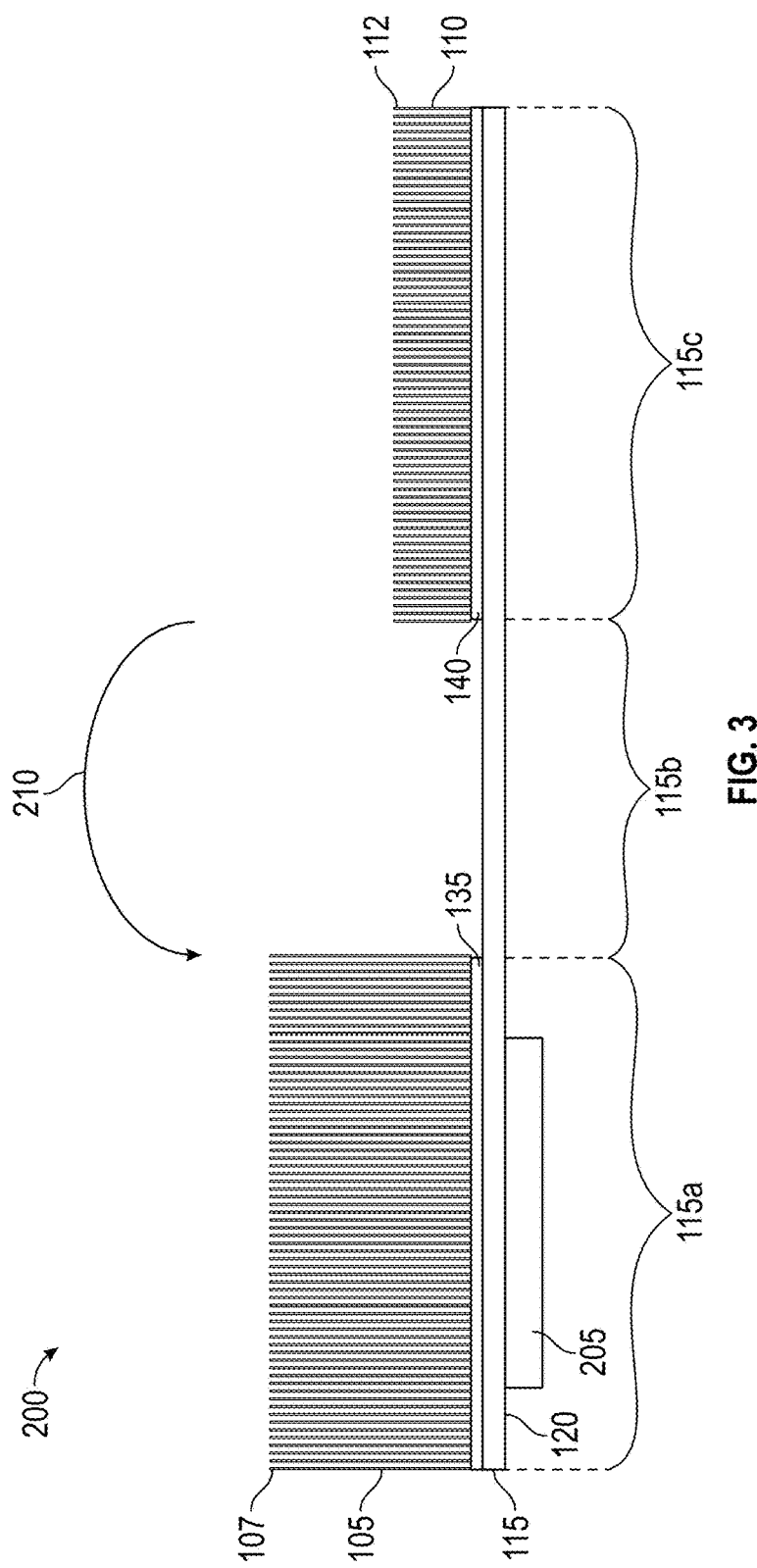
FIG. 3 is a drawing illustrating a side view of an embodiment of a heat sink with a vapor chamber.

FIG. 3 is a drawing illustrating a side view of an embodiment of heat sink 200 with vapor chamber 115. In FIG. 3, heat sink 200 is shown "unfolded" and in contact with a CPU 205 at contact section 120. Heat sink 200 may be configured as heat sink 100 by bending vapor chamber 115 in direction 210 so that upper fin ends 112 are brought near lower fin ends 107.

In an embodiment, a method for manufacturing a heat sink assembly includes the following steps. First, bringing the bases of a first plurality of fins into thermally-conductive contact with a source interface section of a vapor chamber. For example, lower fins 105 may be mounted on source interface section 115a, as in FIG. 3. Second, bringing the bases of a second plurality of fins into thermally-conductive contact with a sink interface section of the vapor chamber, where the source interface section is separated from the sink interface section by a conducting section that is at least as long as the sum of the heights of the first and second pluralities of fins. For example, upper fins 105 may be mounted on sink interface section 115c, with connecting section 115b being made long enough to accommodate two 90-degree bends and the lengths of lower fins 105 and upper fins 110, as in FIG. 3. And third, bending or otherwise configuring the vapor chamber into a squared-off "C" shape so that the ends of the first plurality of fins are adjacent to the ends of the second plurality of fins. For example, in FIG. 3, vapor chamber 115 may be bent at 90 degrees at both a point between the source 115a and connecting section 115b and a point between the sink 115c and connecting section 115c interface to bring fin ends 112 near fin ends 107, as in FIG. 4. At the conclusion of the method, both lower fins 105 and upper fins 110 are disposed between the "bottom" of the "C" (i.e., source interface section 115a) and the "top" of the "C" (i.e., sink interface section 115c) (FIG. 4.)

Figure 4:
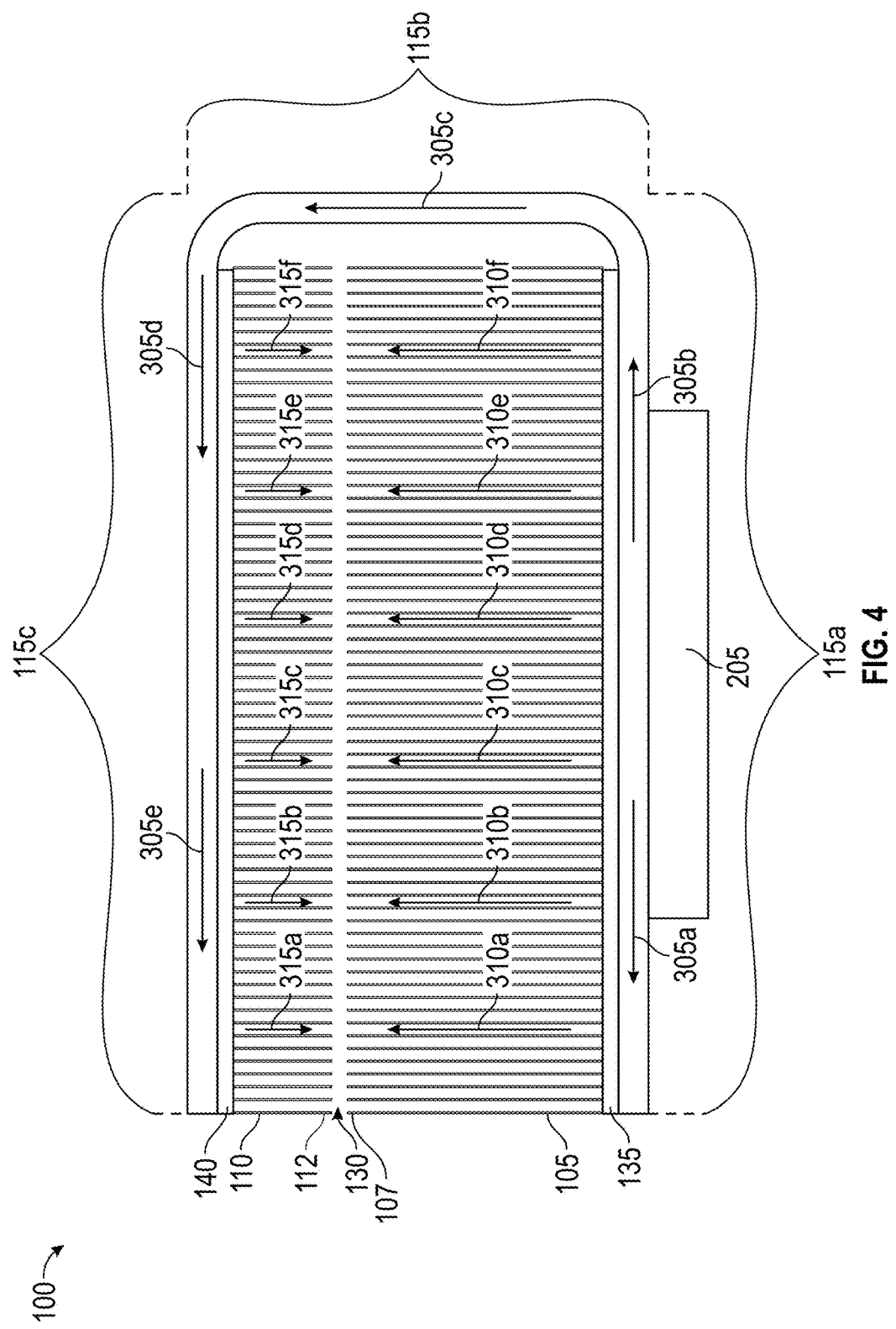
FIG. 4 is a drawing illustrating a side view of an embodiment of a heat sink with a vapor chamber.

FIG. 4 is a drawing illustrating a side view of an embodiment of heat sink 100 with vapor chamber 115. In FIG. 4, lower fins 105 and upper fins 110 are disposed between the "bottom" of the "C" (i.e., source interface section 115a) and the top of the "C" (i.e., sink interface section 115c). Arrows 305a-305e illustrate the direction of heat transfer within vapor chamber 115. Arrows 310a-310f illustrate the direction of heat conduction within lower fins 105. And arrows 315a-315f illustrate the direction of heat conduction within upper fins 110. Gap 130 between fin ends 112 and fin ends 107 may serve to reduce or avoid interference between heat dissipating upper fins 110 and heat dissipating lower fins 105 because, in practice, when folding the heatsink from FIG. 3 to FIG. 4, fin ends 112 and 107 may not match perfectly and may interfere with each other. Thus, having a tolerance gap may be beneficial. In FIG. 4, the side view illustrates that upper fins 110 and lower fins 105 are all substantially parallel, allowing air that flows in one direction to flow through both sets of fins. While upper fins 110 and lower fins 105 are shown as being the same in number, spacing, and width, in embodiments upper fins 110 and lower fins 105 may be different in number, and have different spacing and widths.

In an embodiment, upper fins 110 and lower fins 105 may be replaced with a single set of fins. The single set of fins would each have one end in thermal contact with source interface section 115a and their other end in thermal contact with sink interface section 115c. For example, the single set of fins could be mounted between plates 135 and 140. Plates 135 and 140, with the set of fins could then be slid within a squared-off C-shaped vapor chamber. The C-shaped vapor chamber could be configured to exert a compressive force against plates 135 and 140 to improve the thermal conductivity of their interface. Additionally, thermal grease could be added between vapor chamber 115 and plates 135 and 140 to further improve the thermal conductivity. The single set of fins connected between source interface section 115a and sink interface section 115c may show improved heat dissipation over a similarly-sized heat sink with individual lower fins 105 and upper fins 110 because the direct heat conduction path from fins 105 to fins 110 would improve fin efficiency.

In an embodiment, gap 130 may be filled between fin ends 112 and fin ends 107 with a thermally conductive material, such as a thermal grease, a conductive plate, or a heat spreader to approximate a single set of fins and obtain at least some of the benefits of having a single set of fins rather than lower fins 105 and upper fins 110. In an embodiment, upper fins 110 are offset from lower fins 105 so that gap 130 may be eliminated by making fins 110 and fins 105 overlap somewhat at fin ends 112 and 107. In an embodiment, with fin ends 112 and 107 overlapping, a conductive grease is added between overlapping fin ends 112 and 107 to improve thermal conductivity between fins 105 and 110.

In an embodiment, sink interface section 115c may be disposed between lower fins 105 and upper fins 110 without changing the overall height of the heat sink. In the embodiment, vapor chamber 115 would be configured in a square-off "C" shape with lower fins 105 in thermal contact with source interface section 115a. Connecting section 115b would then need to be only as high as the height of the fins of lower fins 105. Sink interface section 115c would then be directly over lower fins 105. Upper fins 110 would then be mounted on the upper surface of sink interface section 115c. In other words, the embodiment would be layered in the following order: source interface section 115a, lower fins 105, sink interface section 115c, and upper fins 110. Such a configuration may be more applicable for a heat sink with a height greater than a 2 U form factor.

Figure 5:
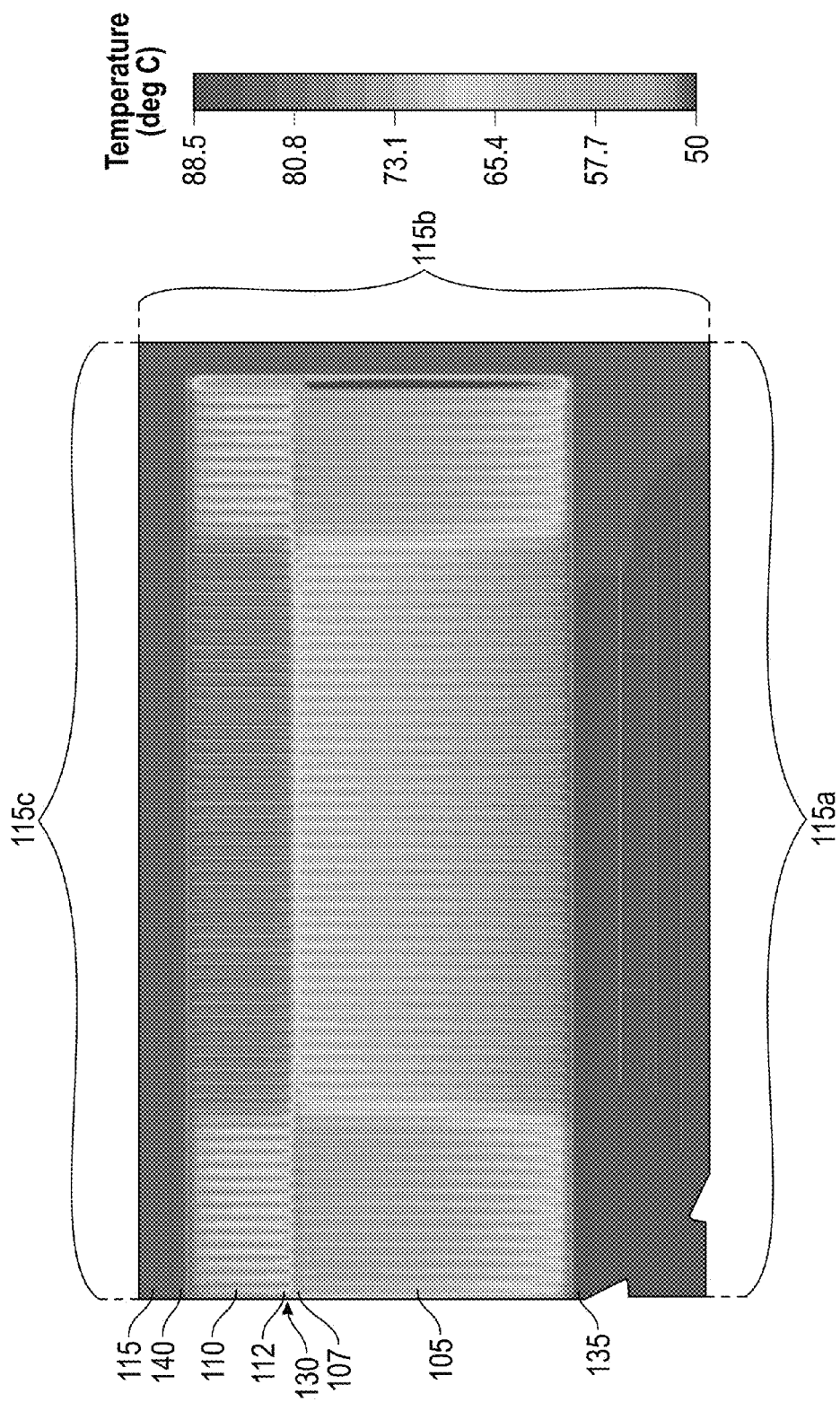
FIG. 5 is a cross-sectional view of a simulated functioning embodiment of a heat sink with a vapor chamber.

FIG. 5 is a cross-sectional view of a simulated functioning embodiment of a 1.5 U heat sink with a vapor chamber. In FIG. 5 the different colors depict different temperatures of an operating embodiment, according to the color/temperature correlating column on the right. Note that the temperatures of upper fins 110 are generally higher than of fins 105, indicating increased heat convection over similarly-sized fins (fins with a total height equivalent to lower fin 105 height plus upper fin 110 height) of a heat sink without a vapor chamber. The fact that upper fins 110 are at a significantly higher temperature than lower fins 105 indicates that the relative fin lengths are not yet optimal. For example, the lengths of upper fins 110 may be increased and the length of lower fins 105 decreased to reduce the temperature difference. Generally, fin temperatures are functions of fin heights and base temperatures (among other variables). The objective is to achieve a maximum heat transfer rate, where the optimum design may vary case by case, and not necessarily result in equal fin temperatures.

The benefits and advantages of the embodiments of the heat sink may include improved fin efficiency and reduced thermal resistance. These improvements should result in cost savings from a corresponding reduction in the fan power required. In a theoretical example, an embodiment required less than two-thirds of an original air flow rate for a CPU heat sink at a maximum ambient temperature, allowing the system fan power to be reduced from 70 W to 25 W).

Figure 6:
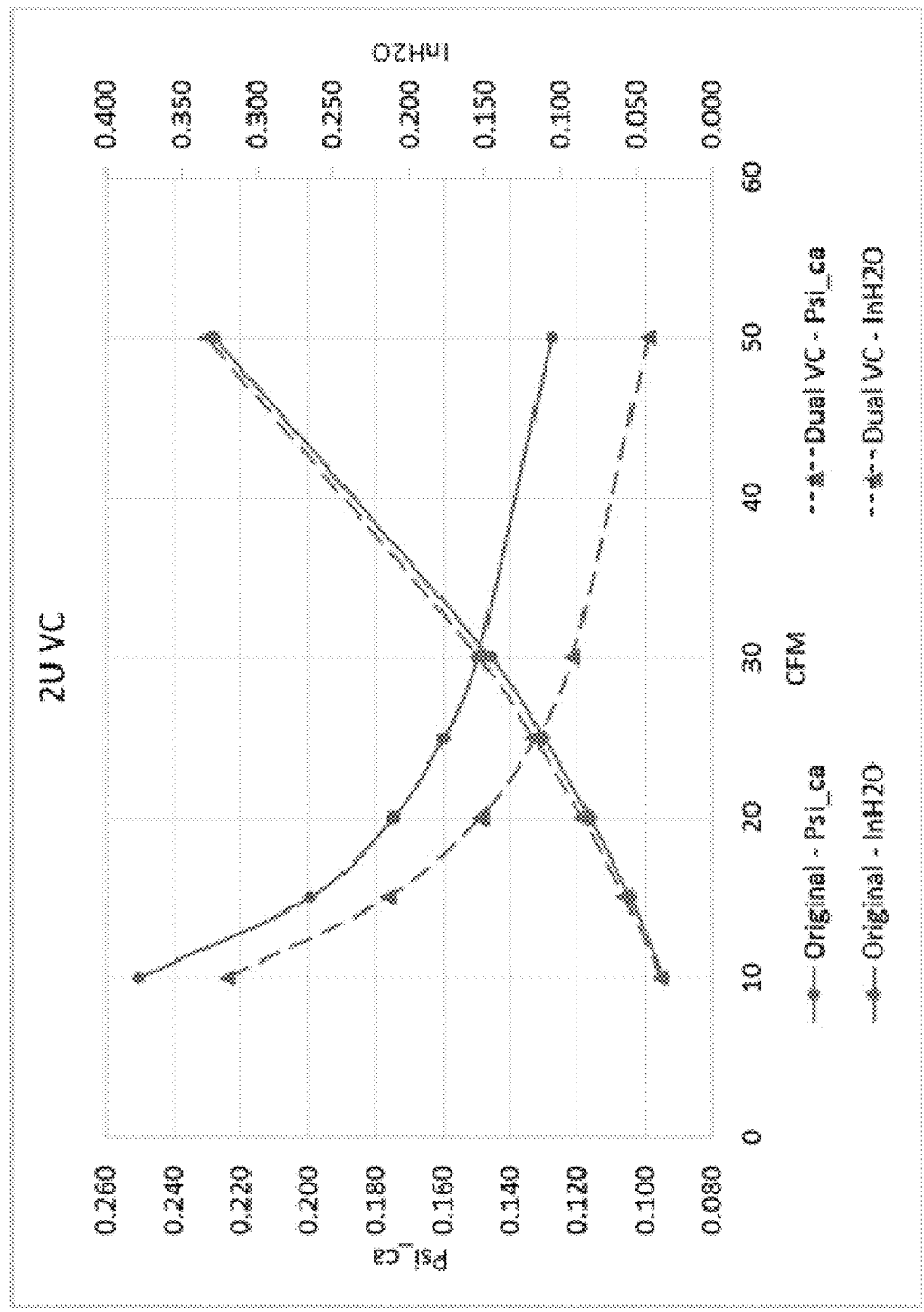
FIG. 6 is a graph depicting data from a simulated embodiment of a heat sink with a vapor chamber.
Figure 7:
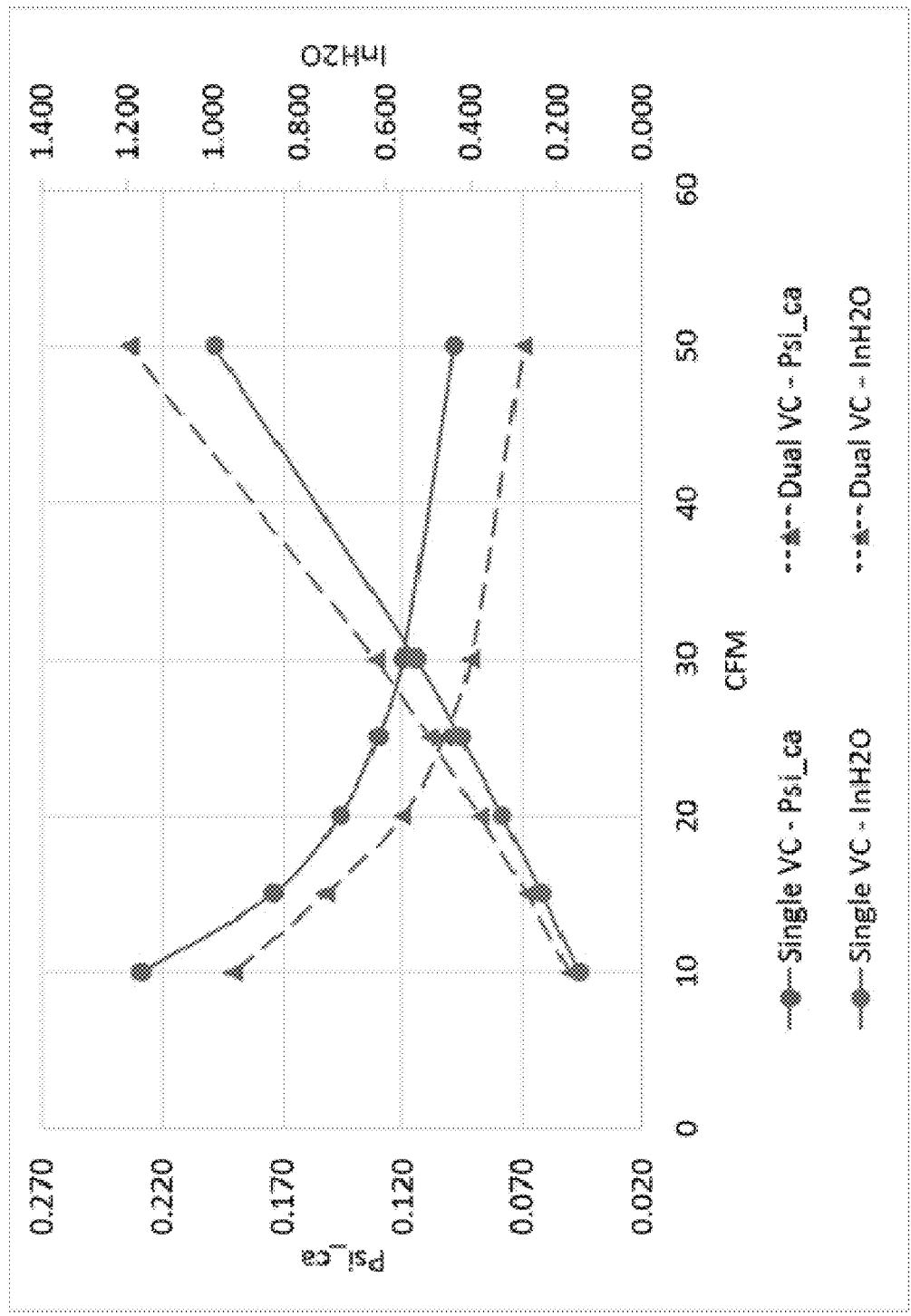
FIG. 7 is a graph depicting data from a simulated embodiment of a heat sink with a vapor chamber.

FIGS. 6 and 7 are graphs from simulations that give evidence of the benefits and advantages of embodiments of the heat sink: improved fin efficiency and reduced thermal resistance. A thermal model based on typical 1.5 U and 2 U heat sinks was build to study theoretical advantages of embodiments. Simulation of the thermal performance of embodiments showed significant improvements over the typical 1.5 U and 2 U heat sinks, at the cost of negligible or small increases in air flow impedance. Such results should allow for considerable reductions in fan power.

FIG. 6 is a graph depicting data from a simulated embodiment of a heat sink with a vapor chamber. In FIG. 6, an embodiment of a 2 U heat sink with a vapor chamber was compared to a typical 2 U heat sink with an aluminum base and heat pipes through the fins. The 2 U heat sink with vapor chamber was modeled using the same fin material, size, and shape, except for the fins being split into the two groups of fins. The graph shows that the thermal resistance (Psi_ca) of the embodiment of a 2 U heat sink with vapor chamber (Dual VC) is improved (reduced) over the typical 2 U heat sink (Original) at the cost of a small pressure increase (InH2O).

FIG. 7 is a graph depicting data from a simulated embodiment of a heat sink with a vapor chamber. In FIG. 7, an embodiment of a 1.5 U heat sink with a vapor chamber was compared to a typical 1.5 U heat sink with an aluminum base and fins. The 1.5 U heat sink with vapor chamber was modeled using the same fin material, size, and shape, except for the fins being split into the two groups of fins. The graph shows that the thermal resistance (Psi_ca) of the embodiment of a 1.5 U heat sink with vapor chamber (Dual VC) is improved (reduced) over the typical 1.5 U heat sink (Original) at the cost of a small pressure increase (InH2O), though the pressure increase was larger than the increase shown in FIG. 6.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. For example, one skilled in the art will recognize that these embodiments can be practiced without one or more of the specific details, or with other components, systems, etc. And, in other instances, there may be structures or operations not shown, or not described in detail, to avoid obscuring aspects of the described embodiments. Therefore, the scope of the appended claims should be accorded the broadest interpretation so as to encompass all such modifications and similar arrangements.

What is claimed is:

1. A heat sink assembly comprising:
a vapor chamber assembly having a vapor chamber surface defining a closed volume, the closed volume containing a working fluid, the vapor chamber assembly having a planar source interface section and a planar sink interface section;
a first fin layer of a plurality of fins, each fin of the first fin layer having a first end and a second end;
a first planar thermally conductive layer sandwiched between the first ends of the first fin layer and the planar source interface section;
   i) the planar source interface section and the first planar thermally conductive layer being parallel to a first plane defined by the termination of the entire length of each first end of the first fin layer,
   ii) the planar source interface section completely overlapping the first planar thermally conductive layer, and
   iii) each fin of the first fin layer in contact with the first thermally conductive layer along the entire first end;
a second fin layer of a plurality of fins, each fin of the second fin layer having a first end and a second end;
a second planar thermally conductive layer sandwiched between the first ends of the second fin layer and the planar sink interface section;
   i) the planar sink interface section and the second planar thermally conductive layer being parallel to a second plane defined by the termination of the entire length of each first end of the second fin layer,
   ii) the planar sink interface section completely overlapping the second planar thermally conductive layer, and
   iii) each fin of the second fin layer in contact with the second thermally conductive layer along the entire first end;
the vapor chamber assembly, the first and second planar thermally conductive layers, and first and second fin layers configured to sandwich the first and second fin layers between the planar source interface section and the planar sink interface section with a planar gap between the entire first fin layer and the entire second fin layer and with the second ends of the first fin layer across the planar gap from the second ends of the second fin layer; and
a thermally-conductive material disposed in the planar gap to create thermally-conductive contact between the second ends of the first fin layer and the second ends of the second fin layer along the entire second ends of the first and second fin layers.

2. The heat sink assembly of claim 1, the fins of the first fin layer having a first length and the fins of the second fin layer having a second length, the first length being different from the second length.

3. The heat sink assembly of claim 2, the difference between the first and second lengths resulting in a first thermal resistance associated with the first fin layer matching a second thermal resistance associated with the second fin layer.

4. The heat sink assembly of claim 1, the thermally conductive material being a second vapor chamber assembly.

5. The heat sink assembly of claim 1, the thermally conductive material including a metal plate.

6. The heat sink assembly of claim 1, each fin of the first and second fin layers being planar and the vapor chamber assembly bending between the planar source interface section and the planar sink interface section.

7. The heat sink assembly of claim 1, each fin of the first and second fin layers being planar, the vapor chamber assembly including a source vapor chamber, a connecting vapor chamber, and a sink vapor chamber, the source vapor chamber including the planar source interface section and the sink vapor chamber including the planar sink interface section, and the connecting vapor chamber being in thermally-conductive contact with the source and sink vapor chambers.

8. The heat sink assembly of claim 1, the first planar thermally conductive layer comprising a first metal plate and the second planar thermally conductive layer comprising a second metal plate.

9. A method for manufacturing a heat sink, the method comprising:
sandwiching a first planar thermally conductive layer between a first fin layer of a plurality of fins and a planar source interface section of a vapor chamber assembly, each fin of the first fin layer having a first end and a second end;
   i) the planar source interface section and the first planar thermally conductive layer being parallel to a first plane defined by the termination of the entire length of each first end of the first fin layer,
   ii) the planar source interface section completely overlapping the first planar thermally conductive layer, and
   iii) each fin of the first fin layer in contact with the first thermally conductive layer along the entire first end;
sandwiching a second planar thermally conductive layer between a second fin layer of a plurality of fins and a planar sink interface section of the vapor chamber assembly, each fin of the second fin layer having a first end and a second end:
   i) the planar sink interface section and the second planar thermally conductive layer being parallel to a second plane defined by the termination of the entire length of each first end of the second fin layer,
   ii) the planar sink interface section completely overlapping the second planar thermally conductive layer, and
   iii) each fin of the second fin layer in contact with the second thermally conductive layer along the entire first end; and
applying a thermally-conductive material to at least one of the second ends of the first fin layer and the second ends of the second fin layer; and
configuring the vapor chamber assembly to dispose the first and second fin layers between the planar source interface section and the planar sink interface section with a planar gap between the entire first fin layer and the entire second fin layer and with the second ends of the first fin layer across the planar gap from the second ends of the second fin layer and with the thermally-conductive material creating a thermally-conductive contact between the second ends of the first fin layer and the second ends of the second fin layer along the entire second ends of the first and second fin layers.

* * * * *